(12) United States Patent
Vivares et al.

(10) Patent No.: US 6,426,290 B1
(45) Date of Patent: Jul. 30, 2002

(54) ELECTROPLATING BOTH SIDES OF A WORKPIECE

(75) Inventors: Valerie Vivares, Palo Alto; Robert Newman, Santa Clara; Edwin R. Fontecha, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 80 days.

(21) Appl. No.: 09/641,351

(22) Filed: Aug. 18, 2000

(51) Int. Cl.[7] ............................................. H01L 21/44
(52) U.S. Cl. ..................... 438/678; 438/108; 438/125; 205/123; 205/125; 205/162; 205/163; 205/164; 205/166; 205/167
(58) Field of Search .................................. 438/108, 125, 438/678; 205/123, 125, 162–164, 166, 167

(56) References Cited

U.S. PATENT DOCUMENTS

| | | |
|---|---|---|
| 4,545,885 A | 10/1985 | Hori et al. |
| 4,595,480 A | 6/1986 | Takiar et al. |
| 4,758,927 A | 7/1988 | Berg |
| 4,768,077 A | 8/1988 | Scherer |
| 4,878,990 A | 11/1989 | Dugan et al. |
| 5,468,993 A | 11/1995 | Tani |
| 5,541,477 A | 7/1996 | Maya et al. |
| 5,819,398 A | 10/1998 | Wakefield |
| 6,117,300 A * | 9/2000 | Carbin et al. ................ 205/125 |
| 6,348,142 B1 * | 2/2002 | Vivares et al. ............... 205/125 |

* cited by examiner

Primary Examiner—David L. Talbott
Assistant Examiner—David A. Zarneke

(57) ABSTRACT

A method of electroplating both sides of a dual-sided circuit board substrate having electrically connected, multi-trace circuit patterns formed on both sides of the substrate, without requiring formation and at least partial removal of electrically conductive tie bars, comprises steps of covering and electrically contacting a first one of the circuit patterns with a first layer of electrically conductive material, applying an electrical potential to the first layer of electrically conductive material to effect electroplating on the second one of the circuit patterns, removing the first layer of electrically conductive material, covering and electrically contacting the second one of the circuit patterns with a second layer of electrically conductive material, applying an electrical potential to the second layer of electrically conductive material to effect electroplating on the first one of the circuit patterns, and removing the second layer of electrically conductive material.

20 Claims, 4 Drawing Sheets

ELECTROPLATING BOTH SIDES OF A WORKPIECE

FIELD OF THE INVENTION

The present invention relates to electroplating both sides of a workpiece in the form of a substantially flat, electrically insulative substrate having electrically interconnected circuit patterns on a pair of opposed major surfaces. More particularly, the present invention relates to a method for electroplating at least one metal or metal alloy layer on electrically conductive patterns on both surfaces of a circuit board substrate utilized for mounting and providing electrical connections to a semiconductor integrated circuit (IC) die or chip, as in ball grid array (BGA) device packages.

BACKGROUND OF THE INVENTION

Electrical circuit boards and similar type components comprising complex, electrically interconnected circuit patterns formed on opposite sides of a planar substrate enjoy widespread utility in the manufacture of electrical and electronic components and devices. For example, an increasingly important aspect of semiconductor integrated circuit (IC) manufacturing technology is mounting of the semiconductor IC die or chip to an appropriate dual-sided substrate as part of a process for forming encapsulated device packages. Frequently, this requires providing the IC chip or die with as many input/output ("I/O") terminals as is feasible. As a consequence of the requirement for a large number of terminals to be formed on a limited amount of substrate surface, so-called "ball grid array" ("BGA") structures and bonding techniques have been developed in order to provide high areal density interconnections between the IC package and, e.g., a larger substrate.

A typical, encapsulated BGA type semiconductor IC device package 1 is shown in schematic, cross-sectional view in FIG. 1. According to such BGA type packaging, an IC die or chip 2 is mounted on a patterned, upper solder mask layer 3U formed on the upper major surface 4U of a dual-sided substrate 4, i.e., a dual-sided printed circuit board ("PCB") or a ceramic or composite material circuit board ("CCB") having an upper circuit pattern 5U formed thereon. A plurality of electrical connections 6 comprising fine electrical wires, typically of gold (Au), are connected, as by wire bonding, between the upper surface 2U of the IC die or chip 2 and a plurality of electrical bonding pad areas 7B (also termed "bond fingers") of the upper circuit pattern 5U exposed through a plurality of openings 3' selectively formed in solder mask layer 3U. Each of the electrically conductive traces or lines forming upper circuit pattern 5U is electrically connected by means of an electrically conductive plug or via 7V filling a through-hole 8 extending through the thickness of substrate 4, to at least one electrically conductive trace or line of a lower circuit pattern 5L formed on the lower major surface 4L of the substrate. A plurality of generally circularly-shaped "ball land areas" 7L are exposed through openings 3" selectively formed in lower solder mask layer 3L overlying substrate lower major surface 4L for accommodating therein a spaced-apart plurality of spherically-shaped electrical conductors 9 formed of a solder material and constituting a two-dimensional ball grid array (BGA). Finally, BGA package 1 includes a layer of molding material 10 encapsulating at least the IC die or chip 2.

According to BGA methodology, the device package with its spherically-shaped BGA solder balls or bumps is then mated with a corresponding ball grid array (BGA) or bonding pad array on a substrate surface. Once mated, the solder balls or bumps of the IC device package and the corresponding solder balls or bumps or bonding pads of the substrate are heated to effect reflow and mutual bonding, whereby each solder ball or bump forms a bond between the IC device package and the substrate. As a consequence, each bonded combination functions as both an electrical and physical contact.

A variant of the above BGA bonding technology, known as "controlled collapse chip connection", or "C4", is particularly useful in applications having a very high density of electrical interconnections. According to C4 methodology, electrically conductive balls or bumps comprising a solder material are formed on the IC device package, as well as on the mating surface of the substrate. Bonding between the two sets of solder balls or bumps is effected by application of heat and mechanical pressure to the IC device package and the substrate. The application of heat causes both sets of solder-based balls or bumps to reflow, thereby providing physical and ohmic electrical connection therebetween, while the applied mechanical pressure causes the mated pairs of solder-based balls or bumps to at least partially collapse, creating a "pancake" shape which advantageously reduces interconnection length and resistance.

An essential feature of the above-described BGA fabrication methodology is the formation of suitable dual-sided substrates 4 having the requisite electrically interconnected circuit patterns 5U, 5L formed on the opposing major surfaces 4U, 4L, wherein the circuit patterns are provided with one or more plated layers for minimizing corrosion due to environmental factors, etc, and for facilitating wetting and adhesion of solder-type contact materials thereto. However, the continuing increase in complexity of the IC chip or die 2 has necessitated a parallel increase in the number of I/O connections required to be made to the IC chip or die. The increase in IC complexity has necessitated a parallel increase in the number and complexity of the requisite electrically conductive traces constituting the upper and lower circuit patterns formed on the substrate, which increase in number and complexity has in turn resulted in a substantial decrease in the inter-trace spacings.

According to conventional methodologies for manufacturing dual-sided circuit boards suitable for use in BGA type packaging applications, multi-trace electrically conductive patterns, typically of copper (Cu) or a Cu-based alloy, are formed, as by conventional techniques, on both major surfaces of a substrate comprised of at least one electrically insulative material selected from polymers, ceramics, glasses, resins, laminates and composites thereof, e.g., epoxy resin-fiberglass composites, and electrically interconnected by means of a plurality electrically conductive via plugs filling through-holes extending between the opposing major surfaces.

FIG. 2A illustrates, in plan view, a corner portion of the upper major surface 4U of a dual-sided substrate 4, wherein each of the individual traces $5T_U$ of upper circuit pattern 5U is shown as extending from the interior portion of upper major surface 4U, where bond fingers 7B are located, to the periphery thereof, where conductive via plugs 7V are formed for electrical interconnection with the lower circuit pattern 4L (which is not necessarily similarly configured). The thus-formed, electrically interconnected upper and lower circuit patterns 5U and 5L are then subjected to a plating process, conventionally electroplating, for depositing thereon a layer or layer system which provides corrosion resistance and facilitates low ohmic resistance bonding of solder-based electrical conductors thereto. Typically, thin layers of Ni and Au are sequentially electroplated over the Cu or Cu-based circuit patterns 5U, 5L for this purpose. According to conventional electroplating processes, at least one electrically conductive tie bar 11 having several lateral extensions 11L, 11R, etc., is formed on at least one of the upper or lower major surfaces (4U or 4L) and in electrical contact with each of the conductive traces on that surface, thereby providing a common electrical contact for connection to a source of electroplating potential, whereby each of the conductive traces $5T_U$ and $5T_L$ of the upper and lower major surfaces 5U and 5L, respectively, are then able to be simultaneously electroplated. The electrical connections between the various conductive traces and tie bar 11 and its several extensions 11L, 11R, etc., are severed after completion of the electroplating.

While the use of electrically tie bars for facilitating simultaneous electroplating of circuit patterns has been generally useful according to prior practices, as a consequence of the increased densification of the traces forming the circuit patterns as required by the progressive increase in IC complexity, the remaining, or free space (or "real estate") on the major surfaces 5U and 5L of the substrate has been progressively reduced to where it currently is at a premium. Stated somewhat differently, trace densification of the circuit patterns has reached a state where the tie bar 11 and its associated extensions 11L, 11R, etc., disadvantageously and deleteriously occupy precious routing space on the substrate surface needed for the additional traces, vias, etc., required by the increased amount of I/O connections to be made to the IC chip or die. Moreover, the presence of the tie bar(s) and associated extensions disadvantageously decreases the signal-to-noise ratio ("SNR") of the device package, and the need to sever the electrical connections between the tie bar and the conductive traces subsequent to electroplating adds additional steps and complexity to the overall substrate preparation process.

FIG. 2B illustrates, in plan view, a corner portion of the upper major surface 4U of an alternately configured dual-sided substrate 4 of conventional type, wherein each of the individual traces $5T_U$ of upper circuit pattern 5U includes a separate tie bar portion 11' for supplying the electrically interconnected upper and lower circuit patterns 5U, 5L with an electrical potential, typically of negative polarity, for cathodically electroplating thereon a layer or layer system (i.e., a plurality of stacked layers) which, inter alia, provides corrosion resistance and facilitates low ohmic resistance bonding of solder-based electrical conductors thereto. However, as in the embodiment illustrated in FIG. 2A, the individual tie bar portions 11' according to the alternate embodiment disadvantageously occupy precious "real estate" on the substrate surface, which "real estate" is currently at a premium due to the increased trace densification resulting from the increase in device complexity.

Accordingly, there exists a need for improved methodology for performing simple, reliable, and rapid electroplating of dual-sided circuit board substrates, which methodology eliminates the need for providing electrically conductive tie bars and associated extensions in electrical contact with the individual conductive traces and other features constituting the conductive circuit patterns prior to electroplating, obviates the need to sever the contacts between the traces and the tie bars subsequent to electroplating, and increases the SNR of the completed device packages.

The present invention, wherein a first layer of an electrically conductive material is placed in temporary electrical contact with a first one of the electrically conductive circuit patterns on a first one of the opposed major surfaces of the substrate for facilitating electroplating of the second one of the electrically conductive patterns on the second major surface, the first layer of electrically conductive material is removed, and a second layer of electrically conductive material is placed in temporary electrical contact with the second one of the electrically conductive patterns on the second one of the opposed major surfaces of the substrate for facilitating electroplating of the first major surface, effectively addresses and solves the need for improved methodology for electroplating electrically interconnected circuit patterns on both sides of a dual-sided substrate while obviating any need for provision, and at least partial removal, of an electrically conductive tie bar with associated lateral extensions. The inventive methodology thus results in process simplification while preserving scarce surface area of the substrate major surfaces for formation of additional electrical traces thereon, and advantageously increases the SNR of the completed device package. Further, the methodology provided by the present invention enjoys diverse utility in the manufacture of numerous and various types of electrical and electronic devices and/or components utilizing dual-sided circuit board substrates.

DISCLOSURE OF THE INVENTION

An advantage of the present invention is an improved method for simple, rapid, and reliable electroplating of printed circuit board and other types of dual-sided substrates comprising electrically interconnected, conductive patterns.

Another advantage of the present invention is an improved method of electroplating dual-sided circuit board substrates for use in fabricating ball grid array (BGA) semiconductor IC device packages.

Yet another advantage of the present invention is an improved method for fabricating encapsulated, BGA semiconductor device packages.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to one aspect of the present invention, the foregoing and other advantages are obtained in part by a method of electroplating a dual-sided workpiece, which method comprises the sequential steps of:

(a) providing a workpiece comprising an insulative substrate including first and second opposed major surfaces, with at least one electrically conductive trace formed on each of said first and second major surfaces, the at least one electrically conductive trace on the first major surface being electrically interconnected to the at least one electrically conductive trace on the second major surface;

(b) covering the at least one electrically conductive trace on the first major surface of the substrate with a first layer of electrically conductive material in electrical contact therewith;

(c) applying an electrical potential to the first layer of electrically conductive material to effect electroplating on the at least one electrically conductive trace on the second major surface;

(d) removing the first layer of electrically conductive material from the first major surface of the substrate;

(e) covering the at least one electrically conductive trace on the second major surface with a second layer of electrically conductive material in electrical contact therewith;

(f) applying an electrical potential to the second layer of electrically conductive material to effect electroplating on the at least one electrically conductive trace on the first major surface thereof; and (g) removing the second layer of electrically conductive material from the second major surface of the substrate.

According to embodiments of the present invention, step (a) comprises providing as the workpiece a dual-sided circuit board comprising a substrate having flat planar first and second opposed major surfaces, wherein each of the first and second opposed major surfaces includes a plurality of spaced-apart electrically conductive traces forming respective first and second circuit patterns on the first and second opposed major surfaces, and the pluralities of electrically conductive traces on the first and second opposed major surfaces are electrically interconnected by a plurality of electrically conductive vias extending through the thickness of the substrate.

According to particular embodiments of the present invention, step (a) comprises providing as the workpiece a substrate wherein the entire surface areas of each of the first and second electrical circuit patterns are exposed; and steps (b) and (e) each comprise covering the entire surface area of a respective one of the first and second electrical circuit patterns.

According to other embodiments of the present invention, step (a) comprises providing as the workpiece a substrate wherein the entire surface area of the first electrical circuit pattern on the first major surface is exposed and only selected portions of the second electrical circuit pattern on the second major surface are exposed; step (b) comprises covering the entire surface area of the first electrical circuit pattern; and step (e) comprises covering only the exposed surface portions of the second electrical circuit pattern.

According to still other embodiments of the present invention, step (a) comprises providing as the workpiece a substrate wherein only selected portions of the surface areas of each of the first and second electrical circuit patterns are exposed; and steps (b) and (c) each comprise covering only the exposed surface portions of the first and second electrical circuit patterns.

According to further embodiments of the present invention, steps (b) and (e) each comprise covering the respective first and second electrical circuit patterns or selected portions thereof by affixing the respective first or second layer of conductive material thereto by means of e.g., a layer of an electrically conductive adhesive, the first and second layers of conductive material being selected from a metal coated insulative sheet and a metal foil; and steps (d) and (g) each comprise removing the respective metal coated insulative sheet or metal foil by stripping away the layer of electrically conductive adhesive from the respective first or second electrical circuit pattern, wherein steps (d) and (g) each further comprise cleaning and rinsing the substrate after stripping away the respective layer of electrically conductive adhesive.

According to preferred embodiments of the present invention, step (a) comprises providing a dual-sided circuit board comprising at least one insulative material selected from the group consisting of polymers, ceramics, glasses, resins, and laminates and composites thereof; and steps (c) and (f) each comprise electroplating at least one metal or metal alloy layer on the at least one electrically conductive trace.

According to another aspect of the present invention, a method of manufacturing an electrical device package comprises:

(a) providing an insulative substrate having substantially planar upper and lower major surfaces, each of the upper and lower major surfaces including thereon a plurality of electrically conductive traces forming respective upper and lower electrical circuit patterns, the traces of the upper electrical circuit pattern being electrically interconnected with the traces of the lower electrical circuit pattern by means of electrically conductive vias extending through the substrate;

(b) applying a layer of an electrically insulative masking material on each of the upper and lower electrical circuit patterns;

(c) selectively removing portions of each layer of masking material to expose selected surface areas of the plurality of electrically conductive traces comprising each of the upper and lower electrical circuit patterns;

(d) covering the exposed surface areas of the upper electrical circuit pattern with a first layer of an electrically conductive material in electrical contact therewith;

(e) contacting at least the lower surface of the substrate with an electroplating bath and applying a cathodic electrical potential to the first layer of electrically conductive material to electroplate at least one metal or metal alloy layer on the exposed surface areas of the lower electrical circuit pattern;

(f) removing the substrate from contact with the electroplating bath and removing the first layer of electrically conductive material from the exposed areas the upper electrical circuit pattern;

(g) covering the exposed surface areas of the lower electrical circuit pattern with a second layer of an electrically conductive material in electrical contact therewith;

(h) contacting the upper surface of the substrate with an electroplating bath and applying a cathodic electrical potential to the second layer of electrically conductive material to electroplate at least one metal or metal alloy layer on the exposed surface areas of the upper electrical circuit pattern; and (i) removing the substrate from contact with the electroplating bath and removing the second layer of electrically conductive material from the exposed surface areas of the lower electrical circuit pattern.

According to embodiments of the present invention:

step (a) comprises providing an insulative substrate comprised of a material selected from the group consisting of polymers, ceramics, glass, resins, and laminates and composites thereof;

step (b) comprises applying a layer of a solder mask material on each of the upper and lower major surfaces of the substrate and covering the respective upper and lower electrical circuit patterns; and step (c) comprises selectively removing portions of the solder mask layer from the upper circuit pattern to form a plurality of electrically conductive bonding pad areas and selectively removing portions of the solder mask layer from the lower circuit pattern to form a plurality of areas for accommodating an array of spaced-apart, spherically-shaped electrical conductors.

According to particular embodiments of the present invention, step (a) comprises providing a substrate wherein each of the upper and lower electrical circuit patterns includes a plurality of copper (Cu) or Cu-based traces; steps (e) and (h) each comprise sequentially electroplating a nickel (Ni) layer and a gold (Au) layer on each of the exposed areas of each of the upper and lower electrical circuit patterns; and the method comprises the further steps of:

(j) affixing a spaced-apart, spherically-shaped electrical conductor to each of the plurality of exposed areas of the lower electrical circuit pattern to form a ball grid array (BGA);

(k) mounting a semiconductor integrated circuit (IC) die or chip on the layer of solder mask material on the upper major surface of the substrate;

(l) forming at least one electrical connection between the IC die or chip and at least one of the bonding pad areas of the upper electrical circuit pattern; and (m) encapsulating at least the IC die or chip in a molding material.

Additional advantages and aspects of the present invention will become apparent to those skilled in the art from the following detailed description, wherein embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWING

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that electroplating of workpieces comprising dual-sided, insulative substrates having electrically interconnected, multi-trace circuit patterns on both major surfaces, e.g., printed circuit boards, can be readily performed without requiring the presence of electrically conductive tie bars for providing electrical contact to each of the traces forming the circuit patterns. A key feature of the present invention is the utilization of temporary, strippable layers of conductive material sequentially applied and removed from the substrate major surfaces, for effecting electrical contact to each of the circuit pattern traces for electroplating on the respective opposite surface. As a consequence of the inventive methodology, the need for performing processing steps for formation and severing (or even removal) of electrically conductive tie bars and associated lateral extensions, is eliminated, leading to process simplification and increase in the surface area available for circuit pattern formation.

Figure 2A:
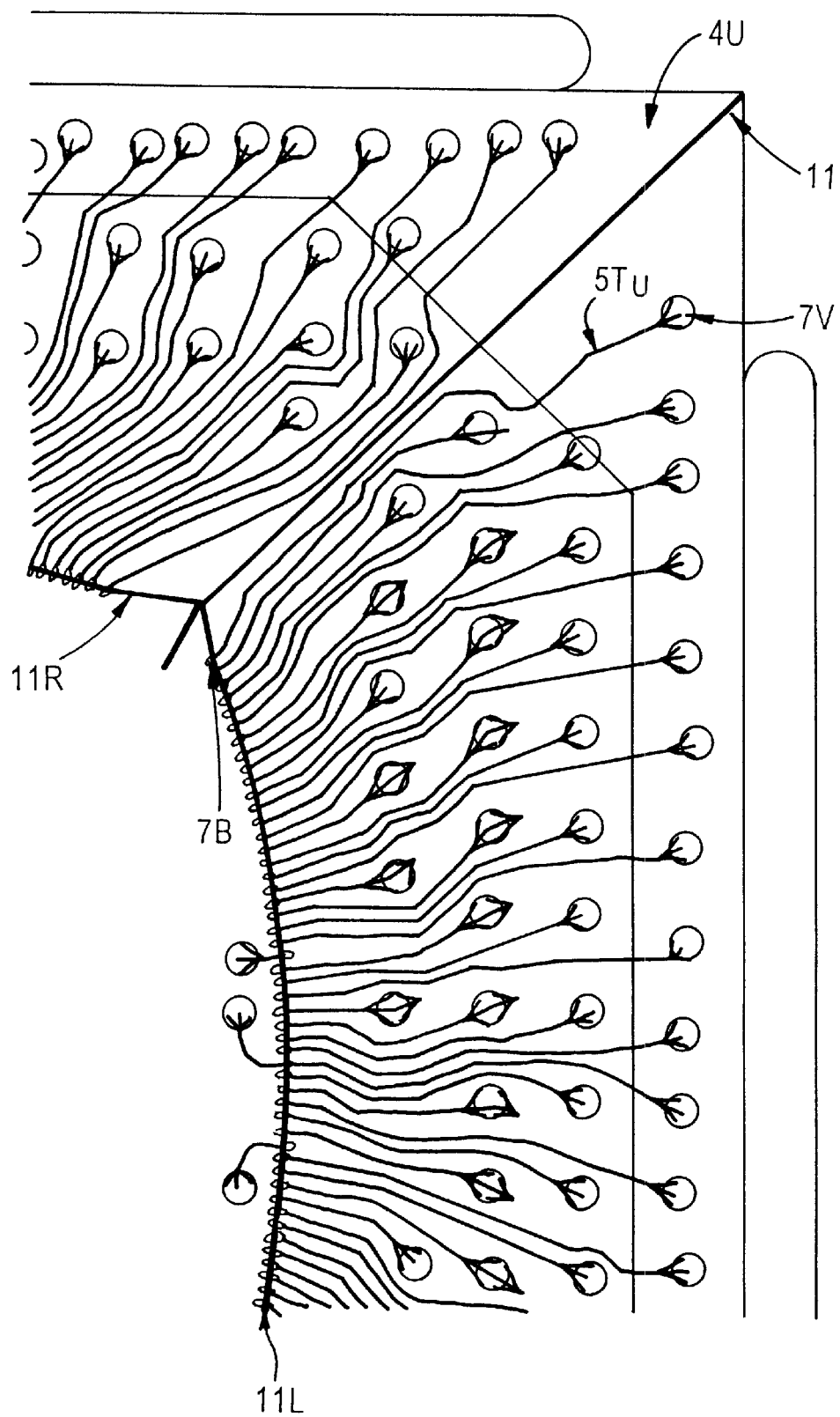
FIGS. 2A–2B are schematic plan views illustrating corner portions of the upper surface of a dual-sided substrates respectively utilizing a single and plural electrically conductive tie bars according to the conventional art.
Figure 2B:
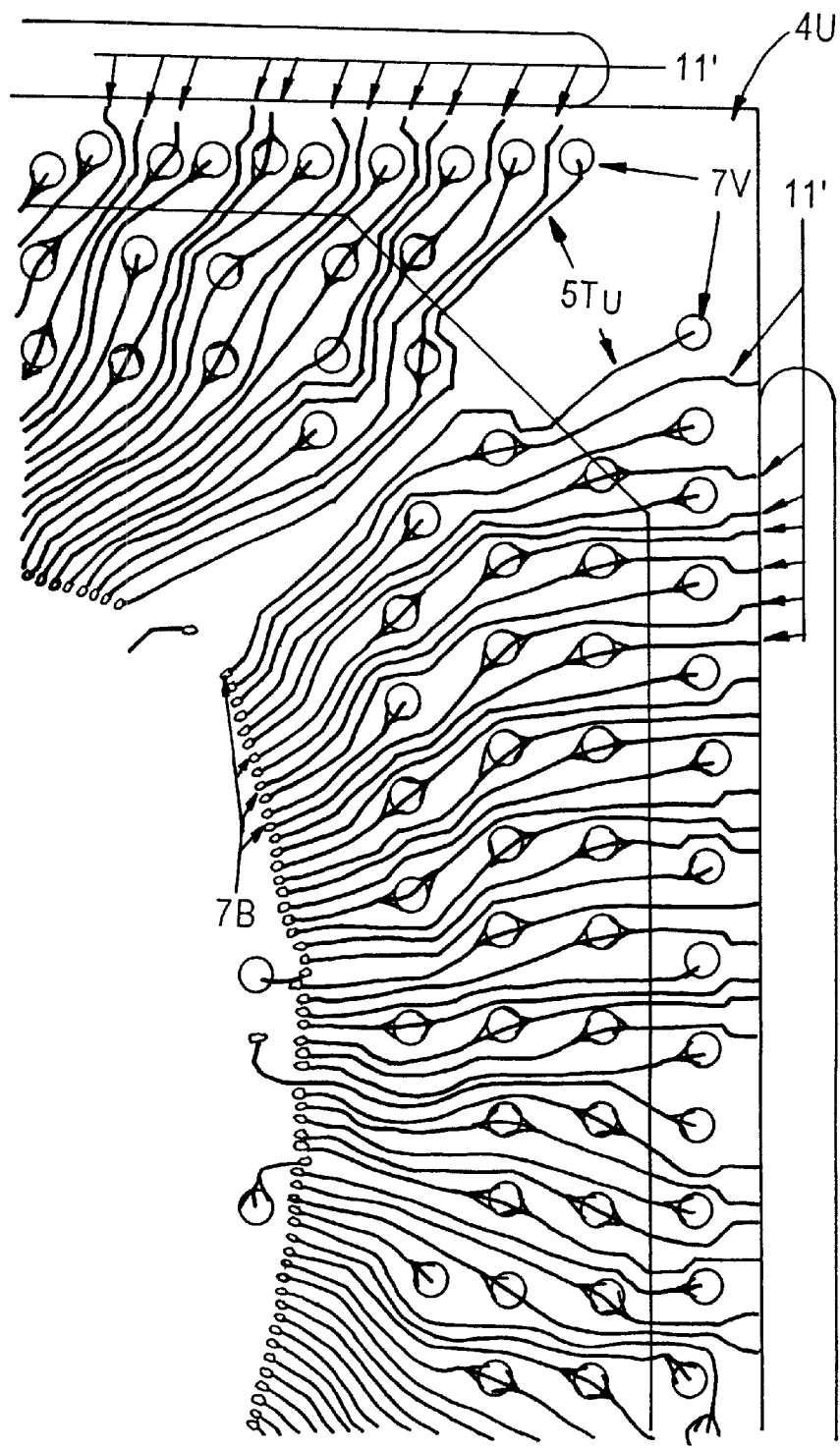
Figure 3:
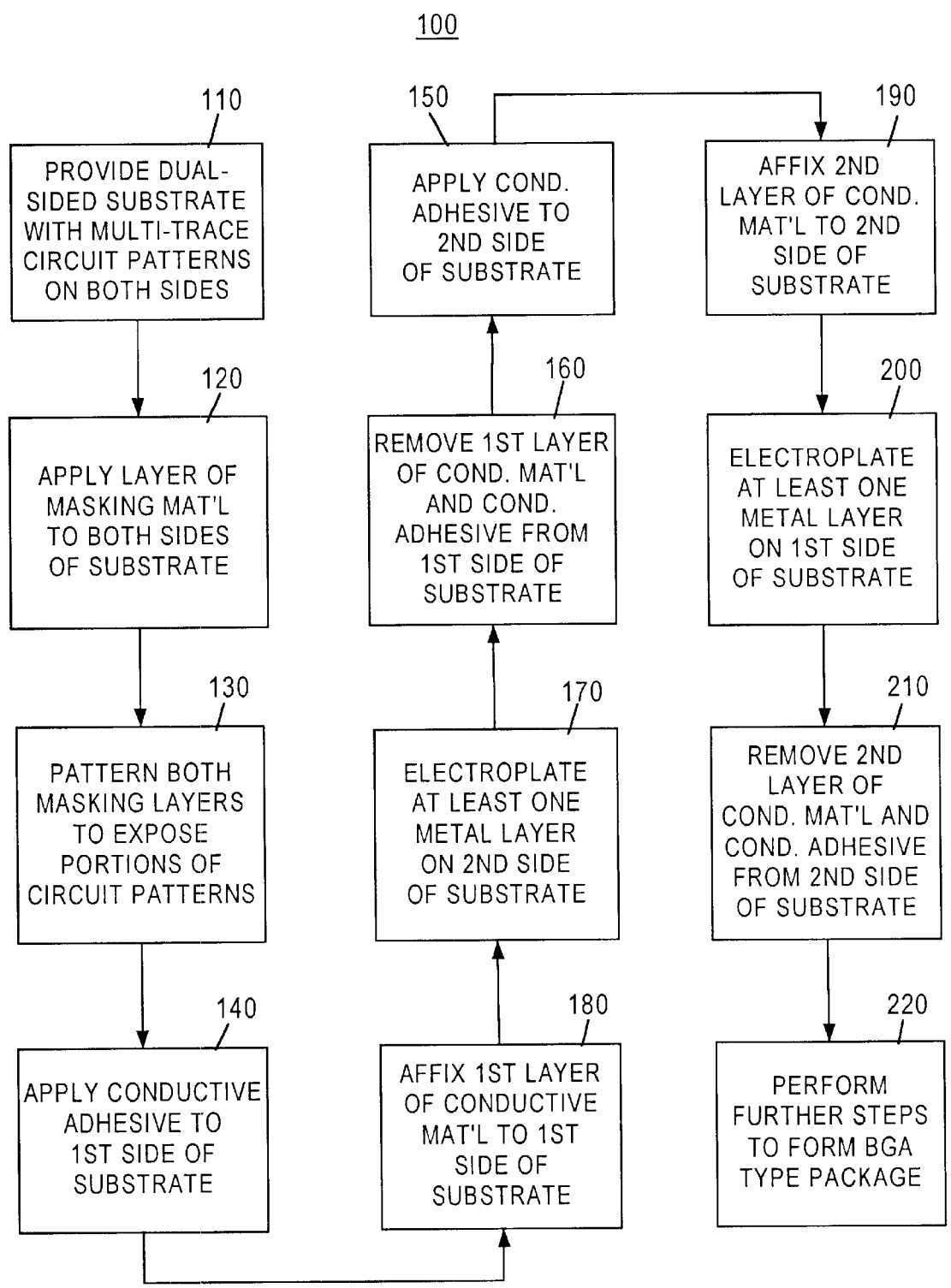
FIG. 3 is a block-type flow diagram illustrating a sequence of steps performed according to the present invention.

Referring now to FIG. 3, shown therein, in block form, is a sequence (100) of processing steps illustrating an embodiment of the present invention. In a first step (110), a workpiece comprising a suitable dual-sided substrate is provided, e.g., of conventional type such as employed in the fabrication of electrical and electronic components and devices, for example, in the BGA type semiconductor IC device package shown in FIG. 1 and described supra. By way of illustration, but not limitation, a suitable workpiece for use according to the invention is a flat planar substrate having a pair (i.e., upper and lower) of opposed, major surfaces and comprised of at least one insulative material selected from polymers, ceramics, glasses, resins, and laminates and composites thereof, e.g., an epoxy resin-fiberglass composite. Circuit patterns, such as shown in the plan view of FIG. 2 described above, and comprised of a plurality of electrically conductive traces, of e.g., copper (Cu) or a Cu-based alloy, configured for use in a particular application, are formed by conventional techniques such as electroplating, photolithographic masking and etching, laser drilling, metal filling, etc., on each of the upper and lower major surfaces of the substrate and electrically interconnected by means of conductive via plugs filling a plurality of through-holes extending through the thickness of the substrate.

According to the second step (120) of the embodiment, a layer of a suitable masking material is applied to each of the major surfaces of the substrate so as to cover the respective circuit patterns thereon. Illustratively, the layers may comprise a solder mask material, e.g., for facilitating subsequent electrical contacts to the circuit patterns by solder-type bonding processes.

In the third step (130) of the embodiment, selected portions of each of the masking material layers are removed, as by conventional photolithographic masking and etching techniques, to expose selected areas of the electrically conductive traces which form the respective circuit patterns, e.g., bonding pad areas (or "fingers") of the circuit pattern on the upper surface of the substrate and "ball land areas" of the circuit pattern on the lower surface of the substrate.

According to the fourth step (140) of the embodiment, a layer of an electrically conductive, tacky adhesive is applied, such as a metal-filled, uncured or partially cured epoxy, as by use of a doctor blade or other suitable application means, to a first one of the major surfaces of the substrate, e.g., the upper major surface, to at least fill the openings in the masking layer formed in the previous step, and thereby form ohmic electrical contact with the conductive traces forming the upper circuit pattern.

In the fifth step (150) of the embodiment, a first layer of an electrically conductive material, e.g., in the form of a metal-coated insulative sheet or a metal foil, is applied to the first major surface of the substrate, i.e., the upper major surface, and adhered thereto by means of the conductive adhesive. Adhesion of the layer of electrically conductive material may, if necessary, be enhanced by application of additional tacky adhesive (not necessarily conductive) to the non-recessed surface areas of the masking layer, or by use of mechanical pressure applied by a clamping means. The layer of first electrically conductive material is provided with at least one extension for facilitating electrical contact to a power source for electroplating.

According to a sixth step (160) according to the invention, the workpiece (i.e., substrate) is then placed in at least one suitable electroplating bath, along with a counter-electrode (e.g., an anode), for plating of at least one metal or metal alloy layer on the exposed areas of the second major surface of the substrate, i.e., the lower circuit pattern, by applying a cathodic electrical potential to the upper circuit pattern via the first layer of electrically conductive material adhered thereto by means of the electrically conductive adhesive. According to the invention, electroplating current flows from the power supply to the lower circuit pattern to effect electroplating of the exposed surface areas thereof, via the first layer of electrically conductive material in contact with the electrically conductive adhesive, the latter being in electrical contact with the various traces of the upper circuit pattern and their respective electrically conductive vias which in turn contact the various traces of the lower circuit pattern. By way of illustration only, nickel (Ni) and gold (Au) layers may be sequentially plated from suitable Ni and Au plating baths onto Cu or Cu-based traces for increasing corrosion resistance and facilitating solder bonding thereto in later processing. Electroplating onto the exposed rear surface of the first layer of electrically conductive material poses no problem when the latter is comprised of a metal-coated insulative sheet; however, in the case when a metal foil is utilized, electroplating on the rear surface thereof can be avoided by, for example, applying an insulative paint or coating thereto, or by utilizing an electroplating apparatus wherein the rear (exposed) surface of the metal foil is prevented from contacting the electroplating bath, as by use of an appropriately configured workpiece holder.

According to a seventh step (170) of the embodiment, the workpiece (substrate), after removal from the final electroplating bath, is rinsed and subjected to treatment for removal, i.e., detachment, of the first layer of electrically conductive material from the upper circuit pattern, as by stripping therefrom. The uncured or partially cured, tacky, electrically conductive adhesive is then removed from the openings formed in the masking layer overlying the upper major surface of the substrate, as by dissolution in a suitable solvent or solvents, e.g., an organic solvent, followed by cleaning and rinsing treatment of the exposed areas of the upper circuit pattern.

Figure 1:
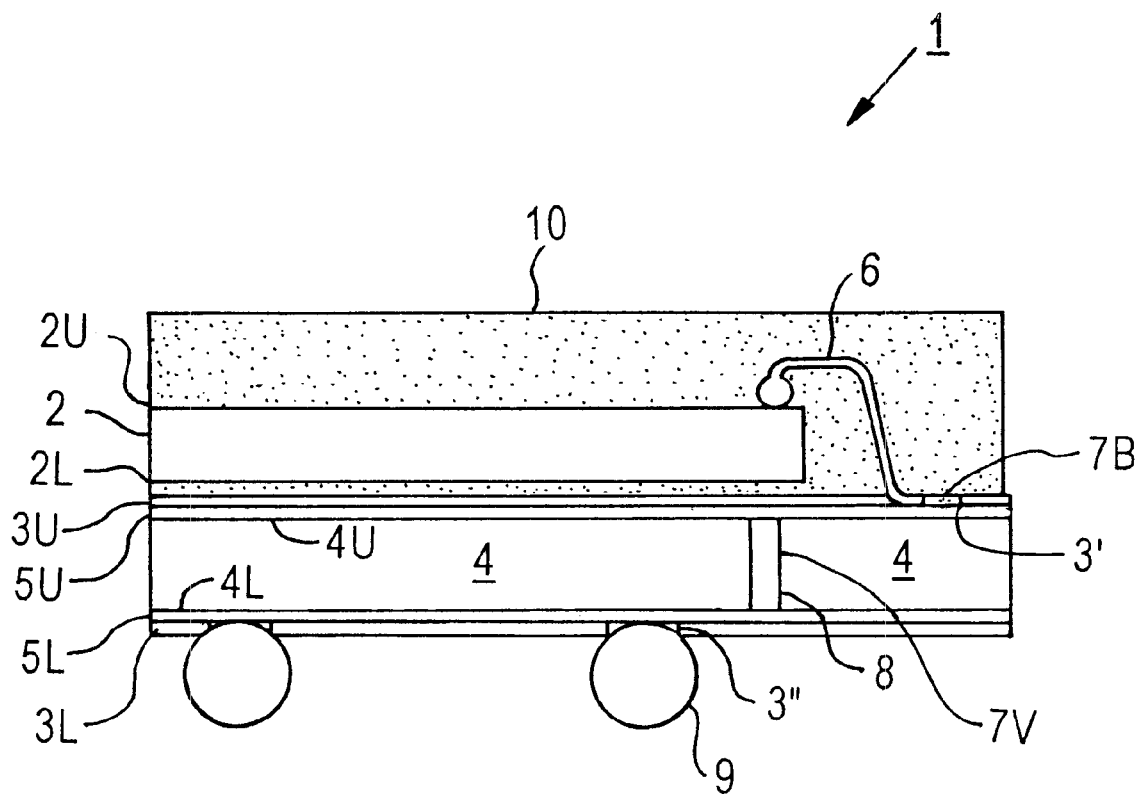
FIG. 1 is a schematic, cross-sectional view of a BGA type semiconductor IC device package comprising a dual-sided substrate prepared according to the principle of the present invention.

According to the inventive methodology, the workpiece substrate is then subjected to eighth through eleventh sequential steps (180–210), fully analogous to the above-described fourth through seventh steps (140–170), for selectively electroplating Ni and Au layers on the exposed areas of the traces constituting the first circuit pattern on the first, i.e., upper major surface of the substrate. After removal of the second layer of electrically conductive material and associated electrically conductive adhesive from the lower circuit pattern and cleaning thereof, the thus-plated substrate is subjected to further processing steps (220), of conventional nature described supra with respect to FIG. 1, to form a desired device or component, e.g., a BGA type semiconductor IC device package as illustrated in FIG. 1.

The inventive principle of utilizing first and second electrically conductive layers for electroplating dual-sided, electrical circuit-containing substrates and thereby eliminating the need for tie bars, is not limited to use with the illustrated embodiment involving formation of semiconductor IC die or chip-based devices, components, or packages. Rather, the inventive methodology can be utilized with all manner of dual-sided printed circuit boards ("PCB"s). Moreover, the invention can be effectively employed in instances where the insulative masking layer of the illustrated embodiment is not required to be formed over either of the circuit patterns, or need be formed over only one of the circuit patterns. In such instances where a patterned insulative masking layer is not formed, the layer of electrically conductive material utilized therewith is able to contact the entire surface area of the circuit pattern. As a consequence, contact between the layer of electrically conductive material and the circuit pattern may be effected by use of a clamping means, whereby the electrically conductive adhesive layer for affixing the layer of electrically conductive material to the circuit pattern may be dispensed with.

A number of advantages over conventional technology for electroplating of dual-sided substrates comprising electrically interconnected circuit patterns are thus provided by the inventive methodology, including, inter alia, elimination of the requirement for the provision (and at least partial removal) of tie bars and their associated lateral extensions, retention of the surface area otherwise occupied by the tie bars and their lateral extensions for use in forming additional conductive traces, etc., of the circuit patterns, and an increase in the SNR of the completed device package.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of electroplating a dual-sided workpiece, which method comprises the sequential steps of:

(a) providing a workpiece comprising an insulative substrate including first and second of opposed major surfaces, with at least one electrically conductive trace formed on each of said first and second major surfaces, said at least one electrically conductive trace on said first major surface being electrically interconnected to said at least one electrically conductive trace on said second major surface;

(b) covering said at least one electrically conductive trace on said first major surface of said substrate with a first layer of electrically conductive material in electrical contact therewith;

(c) applying an electrical potential to said first layer of electrically conductive material to effect electroplating on said at least one electrically conductive trace on said second major surface;

(d) removing said first layer of electrically conductive material from said first major surface of said substrate;

(e) covering said at least one electrically conductive trace oil said second major surface with a second layer of electrically conductive material in electrical contact therewith;

(f) applying an electrical potential to said second layer of electrically conductive material to effect electroplating on said at least one electrically conductive trace on said first major surface; and (g) removing said second layer of electrically conductive material from said second major surface of said substrate.

2. The method as in claim 1, wherein:
step (a) comprises providing as said workpiece a dual-sided circuit board comprising a substrate having flat planar first and second opposed major surfaces, wherein each of said first and second opposed major surfaces includes a plurality of spaced-apart electrically conductive traces forming respective first and second electrical circuit patterns, and said pluralities of electrically conductive traces on said first and second opposed major surfaces are electrically interconnected by a plurality of electrically conductive vias extending through the thickness of said substrate.

3. The method as in claim 2, wherein:
step (a) comprises providing as said workpiece a substrate wherein the entire surface areas of each of said first and second electrical circuit patterns are exposed; and
steps (b) and (e) each comprise covering the entire surface area of a respective one of said first and second electrical circuit patterns.

4. The method as in claim 2, wherein:
step (a) comprises providing as said workpiece a substrate wherein the entire surface area of said first electrical circuit pattern on said first major surface is exposed and only selected portions of said second electrical circuit pattern on said second major surface are exposed;
step (b) comprises covering the entire surface area of said first electrical circuit pattern; and
step (e) comprises covering only said exposed surface portions of said second electrical circuit pattern.

5. The method as in claim 2, wherein:
step (a) comprises providing as said workpiece a substrate wherein only selected portions of the surface areas of each of said first and second electrical circuit patterns are exposed; and
steps (b) and (e) each comprise covering only said exposed surface portions of said first and second electrical circuit patterns.

6. The method as in claim 2, wherein:
steps (b) and (e) each comprise covering the respective first and second electrical circuit patterns or selected portions thereof by affixing the respective first or second layer of electrically conductive material thereto.

7. The method as in claim 6, wherein:
steps (b) and (e) each comprise affixing a layer of an electrically conductive material selected from a metal coated insulative sheet and a metal foil.

8. The method as in claim 7, wherein:
steps (b) and (e) each comprise affixing said metal coated insulative sheet or metal foil to the respective first or second electrical circuit pattern by means of a layer of an electrically conductive adhesive.

9. The method as in claim 8, wherein:
steps (d) and (g) each comprise removing the respective metal coated insulative sheet or metal foil by stripping said layer of electrically conductive adhesive away from the respective first or second electrical circuit pattern.

10. The method as in claim 9, wherein:
steps (d) and (g) each further comprise cleaning and rinsing said substrate after stripping away the respective layer of electrically conductive adhesive.

11. The method as in claim 2, wherein:
step (a) comprises providing a dual-sided circuit board comprising at least one insulative material selected from the group consisting of polymers, ceramics, glasses, resins, and laminates and composites thereof.

12. The method as in claim 1, wherein:
steps (c) and (f) each comprise electroplating at least one metal layer or metal alloy layer on the respective at least one electrically conductive trace.

13. A method of manufacturing an electrical or electronic device, comprising:

(a) providing an insulative substrate having substantially planar upper and lower major surfaces, each of said upper and lower major surfaces including thereon a plurality of electrically conductive traces forming respective upper and lower electrical circuit patterns, said traces of said upper electrical circuit pattern being electrically interconnected with said traces of said lower electrical circuit pattern by means of electrically conductive vias extending through said substrate;

(b) applying a layer of an electrically insulative masking material on each of said upper and lower electrical circuit patterns;

(c) selectively removing portions of each layer of masking material to expose selected surface areas of said plurality of electrically conductive traces comprising each of said upper and lower electrical circuit patterns;

(d) covering the exposed surface areas of said upper electrical circuit pattern with a first layer of an electrically conductive material in electrical contact therewith;

(e) contacting at least said lower surface of said substrate with an electroplating bath and applying a cathodic electrical potential to said first layer of electrically conductive material to electroplate at least one metal or metal alloy layer on the exposed surface areas of said lower electrical circuit pattern;

(f) removing said substrate from contact with said electroplating bath and removing said first layer of electrically conductive material from the exposed areas of said upper electrical circuit pattern;

(g) covering the exposed surface areas of said lower electrical circuit pattern with a second layer of an electrically conductive material in electrical contact therewith;

(h) contacting at least said upper surface of said substrate with an electroplating bath and applying a cathodic electrical potential to said second layer of electrically conductive material to electroplate at least one metal or metal alloy layer on the exposed surface areas of said upper electrical circuit pattern; and (i) removing said substrate from contact with said electroplating bath and removing said second layer of electrically conductive material from the exposed surface areas of said lower electrical circuit pattern.

14. The method as in claim 13, wherein:
step (a) comprises providing an insulative substrate comprised of a material selected from the group consisting of polymers, ceramics, glass, resins, and laminates and composites thereof;

step (b) comprises applying a layer of a solder mask material on each of said upper and lower major surfaces of said substrate and covering the respective upper and lower electrical circuit patterns; and step (c) comprises selectively removing portions of said solder mask layer from said upper circuit pattern to form a plurality of electrically conductive bonding pad areas and selectively removing portions of said solder mask layer from said lower circuit pattern to form a plurality of areas for accommodating an array of spaced-apart, spherically-shaped electrical conductors.

15. The method as in claim 14, wherein:

steps (d) and (g) each comprise affixing a layer of an electrically conductive material to the respective upper or lower electrical circuit pattern by means of a layer of an electrically conductive adhesive applied to at least said exposed areas of said upper and lower electrical circuit patterns.

16. The method as in claim 15, wherein:

steps (d) and (g) each comprise affixing a layer of an electrically conductive material selected from a metal coated insulative sheet and a metal foil; and steps (f) and (i) each comprise removing the respective metal coated insulative sheet or metal foil by stripping said layer of electrically conductive adhesive away from the respective upper or lower electrical circuit pattern.

17. The method as in claim 14, wherein:

step (a) comprises providing an insulative substrate wherein each of said upper and lower electrical circuit patterns includes a plurality of copper (Cu) or Cu-based traces.

18. The method as in claim 17, wherein:

steps (e) and (h) each comprise sequentially electroplating a nickel (Ni) layer and a gold (Au) layer on each of said exposed areas of each of said upper and lower electrical circuit patterns.

19. The method as in claim 13, further comprising the steps of:

(j) affixing a spherically-shaped electrical conductor to each of said plurality of exposed areas of said lower electrical circuit pattern to form a ball grid array (BGA);

(k) mounting a semiconductor integrated circuit (IC) die or chip on said layer of solder mask material on said upper major surface of said substrate; and (l) forming at least one electrical connection between said IC die or chip and at least one of said bonding pad areas of said upper electrical circuit pattern.

20. The method as in claim 19, further comprising the step of:

(m) encapsulating at least said IC die or chip in a molding material.

* * * * *